United States Patent [19]
Yamada et al.

[11] Patent Number: 5,341,390
[45] Date of Patent: Aug. 23, 1994

[54] SURFACE EMITTING SECOND HARMONIC GENERATING DEVICE

[75] Inventors: Norihide Yamada, Tokyo; Yoshikatsu Ichimura, Kanagawa, both of Japan

[73] Assignee: Hewlett-Packard Company, Palo Alto, Calif.

[21] Appl. No.: 47,969

[22] Filed: Apr. 15, 1993

[30] Foreign Application Priority Data

Apr. 16, 1992 [JP] Japan .................. 4-122583

[51] Int. Cl.$^5$ .............................................. H01S 3/19
[52] U.S. Cl. .................................... 372/45; 372/22; 372/50; 372/92
[58] Field of Search ............ 372/22, 21, 44, 45, 372/50, 92

[56] References Cited

U.S. PATENT DOCUMENTS

| | | | |
|---|---|---|---|
| 5,245,622 | 9/1993 | Jewell | 372/46 |
| 5,256,596 | 10/1993 | Ackley et al. | 372/45 |
| 5,274,655 | 12/1993 | Shieh et al. | 372/45 |

FOREIGN PATENT DOCUMENTS

| | | | |
|---|---|---|---|
| 63-280484 | 3/1989 | Japan | H01S 3/109 |
| 04307524 | 3/1993 | Japan | |

OTHER PUBLICATIONS

D. Vakhshoori, et al., "Blue-green surface emitting second harmonic generators on (111)B GaAs", Applied Physics Letters, vol. 59, No. 8, Aug. 19, 1991, New York, US, pp. 896-898.

Y. H. Wang, et al., "Observation of reduced current thresholds in GaAS/AlGaAs vertical cavity surface emitting lasers grown on 4 degree off-orientation (001) GaAs substrates", Applied Physics Letters, vol. 57, No. 16, Oct. 15, 1990, New York, US, pp. 1613-1615.

Nakamura et al., "High-Power GaN P-N Junction Blue-Light-Emiting Diodes" Japanese Journal of Applied Physics, Dec. 1991, vol. 30 No. 12A 4998-L2001.

Haase et al., "Blue-Green Laser Diodes", Appl. Phys. Lett., Sep. 9, 1991, 59(11).

Ogasawara et al., "Second Harmonic Generation in an AlGaAs Double-Heterostructure Laser", Aug. 1987, vol. 26 No. 8 1386-1387.

Yariv, "Optical Electronics", Optical Electronics Fourth Edition, 1991 280-284.

I. Iga & F/Koyama, "Surface Emitting Lasers", Sep. 25, 1990, 265-270.

Kinoshita et al., "GaAlAs/GaAs Surface Emitting Laser with High Reflective TiO2/SiO2 Multilayer Bragg Reflector", Mar. 1987 vol. 26 No. 3 410-415.

*Primary Examiner*—James W. Davie

[57] ABSTRACT

A surface emitting second harmonic generating device capable of generating a second harmonic at room temperatures with high efficiency and output power, and which has a small size, low energy consumption and a low manufacturing cost. A second harmonic is efficiently generated when the <100> direction of the semiconductor crystals within a cavity makes an angle of 5° or more with respect to the direction of the light rays (particularly when one of the <111>, <211> and <110> directions approximately matches the direction of the light rays). Further, if a superlattice second harmonic generating layer composed of a III-V or II-VI compound semiconductor is provided between the output end reflector and the spacer layer, the second harmonic may be generated with even greater efficiency. In addition, the spacer layer may be formed by a superlattice, as may the active layer and the spacer layers. A second harmonic may also be efficiently generated by utilizing the spacer layer and the active layer as phase-matching layers.

16 Claims, 5 Drawing Sheets

A CRYSTAL IN FIGURE 4(B) IS ROTATED AROUND Z-AXIS BY −5°

$$\begin{pmatrix} 0.023 & 0.973 & -0.996 & 0.000 & 0.000 & 0.172 \\ 0.172 & -0.259 & 0.087 & 0.000 & 0.000 & 0.973 \\ 0.000 & 0.000 & 0.000 & 0.087 & -0.996 & 0.000 \end{pmatrix}$$

X-AXIS: [211]  Y-AXIS: [1̄11]  Z-AXIS: [01̄1]

$$\begin{pmatrix} 0.816 & 0.000 & -0.816 & 0.000 & 0.000 & 0.577 \\ 0.577 & -1.155 & 0.577 & 0.000 & 0.000 & 0.000 \\ 0.000 & 0.000 & 0.000 & 0.577 & -0.816 & 0.000 \end{pmatrix}$$

X-AXIS: [111]  Y-AXIS: [2̄11]  Z-AXIS: [01̄1]

$$\begin{pmatrix} 1.155 & -0.577 & -0.577 & 0.000 & 0.000 & 0.000 \\ 0.000 & -0.816 & 0.816 & 0.000 & 0.000 & -0.577 \\ 0.000 & 0.000 & 0.000 & 0.816 & -0.577 & 0.000 \end{pmatrix}$$

SURFACE EMITTING SECOND HARMONIC GENERATING DEVICE

FIELD OF THE INVENTION

The present invention relates generally to a surface emitting second harmonic generating device, and more particularly to a surface emitting second harmonic generating device which is capable of highly efficient extraction of a second harmonic (especially monochromatic light, such as violet, blue and green), in a direction perpendicular to a substrate.

BACKGROUND OF THE INVENTION

Lasers and light emitting diodes (LEDs) are used as sources of blue light in various fields of optoelectronics, such as optical measurement, optical transmission and optical displays. Light-emitting devices which use LEDs (particularly those which emit blue light) utilizing GaN semiconductors are known (see, e.g., refer to S. Nakamura, T. Mukai and M. Senoh: *Jpn. J. Appl. Phys.*, Vol. 30 (1991) L1998). However, since the line width of LED light is wide (a single wavelength cannot be created), lasers have in recent years been more widely used than LEDs in the field of optoelectronics.

For example, with some ZnCdSSe semiconductor lasers, an acceptable blue light output is obtainable (see, e.g., M. A. Hasse, J. Qiu, J. M. DePuydt and H. Cheng: *Appl. Phys. Lett.*, Vol. 59 (1991) 1272). Nevertheless, under the present circumstances such devices can only be used upon cooling to extremely low temperatures, and therefore a practical light output cannot be obtained at a room temperature.

In addition, light-emitting devices that introduce high-power solid laser light or high-power semiconductor laser light into non-linear optical crystals (e.g., dielectric substances such as LiNbO$_3$ and KNbO$_3$, semiconductors such as GaAs, organic substances, etc.) to generate a second harmonic are known (e.g., refer to A. Yariv: *Introduction to Optical Electronics*, 4th ed.; Saunders College Publishing, (Holt, Rinehart and Winston, 1991)). As shown in FIG. 6, in this type of device a laser source 23 and non-linear optical crystals 24 are arranged between a pair of optical reflectors 21, 22, and laser light is launched through the non-linear optical crystals 24 to generate a second harmonic, and blue light is extracted from the reflector 22 which has the higher transmission of the second harmonic. However, the larger the size of the device, the greater the cost of its production, and since it is composed of a combination of multiple components, its problems include extremely difficult control and unstable output.

Further, devices are known which extract a second harmonic from the end surface of normally striped GaAs or AlGaAs semiconductor lasers (see, e.g., N. Ogasawara, R. Ito, H. Rokukawa and W. Katsurashima: *Jpn. J. Appl. Phys.*, Vol. 26 (1987) 1386), but the power of the fundamental wave inside these devices is low due to a low end facet reflectivity. Also, the absorption loss is large due to the long cavity. These device have even greater difficulty in achieving a structure for phase matching. These disadvantages make it impossible to generate the second harmonic with high efficiency.

Further thought has been directed towards extraction of a second harmonic in the direction perpendicular to the cavity. See, e.g., D. Vakhshoori, R. J. Fisher, M. Hong, D. L. Sivco, G. J. Zydzik, G. N. S. Chu and A. Y. Cho: *Appl. Phys. Lett.*, Vol. 59 (1991) 896. However, in a device of the type disclosed in this publication, the output power of the second harmonic is small and the emitted light is distributed over a wide range, therefore condensing of the light is difficult; thus, at present, a practical application for this device has not yet been achieved.

SUMMARY OF THE INVENTION

The present invention was conceived with an object to overcome the disadvantages described above, and to provide surface emitting second harmonic generating devices capable of generating a second harmonic with high efficiency and at a high power at near-room temperatures (for example, −30° C. to approximately +100° C.), and which also features a small size, low energy consumption, and low manufacturing cost.

A surface emitting second harmonic generating device in accordance with the present invention comprises, as a cavity, an active layer composed of semiconductor crystals of a III-V group compound; a first spacer layer disposed on a first side of the active layer and a second spacer layer disposed on a second side of the active layer; and a first reflector disposed on the first spacer layer opposite the active layer and a second reflector disposed on the second spacer layer opposite the active layer, wherein the second reflector transmits the second harmonic at a prescribed rate. According to the invention, the <100> direction of the semiconductor crystals makes an angle of at least 5° with respect to the direction of light rays propagating in the cavity.

Preferably, one of the <111>, <211> and <110> directions of the semiconductor crystals within the cavity approximately matches the direction of the light rays.

In addition, in preferred embodiments of the present invention, a phase-matching layer of superlattice structure, composed of one of a III-V and II-VI compound semiconductor and having an orientation substantially identical to that of the semiconductor crystals within the cavity, is disposed between the second reflector, which transmits the second harmonic at the prescribed rate, and the second spacer layer.

In addition, the second spacer layer may be composed of a superlattice which also functions as a phase-matching layer. Alternatively, the active layer and at least one of the spacer layers may be composed of superlattices which also function as phase-matching layers.

Other features of the present invention are described below.

DETAILED DESCRIPTION OF PREFERRED EMBODIMENTS

Much attention has been given recently to vertical cavity surface emitting lasers (e.g., refer to "Surface Emitting Lasers" by Kenichi Iga and Fumio Koyama: Ohmusha, Ltd., 1990). These surface emitting lasers are used as, for example, (1) a light source for writing and reading data in light magnetic disk devices, (2) a light source for medical equipment which utilize photoluminescence, and (3) a light source in displays which utilize a laser.

Figure 7:
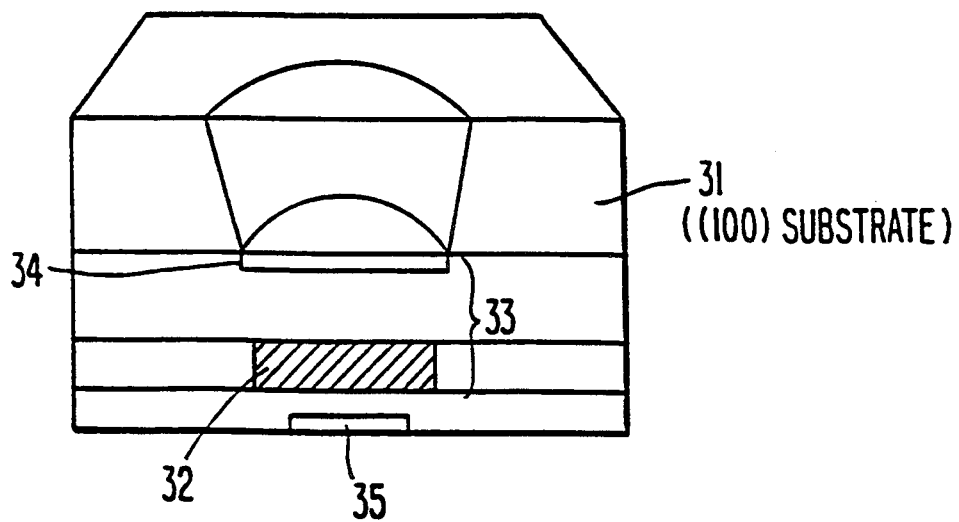
FIG. 7 is a cross-sectional diagram showing an overview of a surface emitting laser.

As shown, for example, in FIG. 7, such types of surface emitting lasers are constructed in such a way as to include a vertical cavity 33 containing an active region 32, which is constructed on a (100) substrate (i.e., a crystal base plate whose surface orientation matches the (100) crystallographic axis direction), and reflectors 34, 35 which are formed on both ends of the vertical cavity and have a high reflectivity. The reflectors 34, 35 generally are semiconductor multi-layer films or dielectric multi-layer films. At room temperatures, such surface emitting lasers exhibit single mode lasing with a single wavelength up to an output power of a few milliwatts. The light intensity inside the cavity is estimated to be over 100 times the output power, or a few hundred milliwatts.

The inventors of the present invention noted the following properties of a III-V compound semiconductor vertical cavity surface emitting laser such as the one shown in FIG. 7:

(1) the efficiency when converting a fundamental wave to a second harmonic is in proportion to the power of the fundamental wave, and thus if the second harmonic can be generated inside the vertical cavity laser, the light intensity of the fundamental wave is extremely favorable to generation of the second harmonic;

(2) the vertical cavity laser includes a pair of reflectors, one of which may be characterized to transmit the second harmonic; and (3) the crystals comprising it have a large non-linear coefficient.

Additionally, further research revealed that a phase-matching layer formed inside the vertical cavity surface emitting laser can contribute to manufacture a second harmonic generating device that is smaller, has lower energy consumption, and has a lower production cost.

A surface emitting second harmonic generating device according to the present invention is based on the above mentioned facts, and comprises, as a cavity, an active layer composed of semiconductor crystals of a III-V compound; spacer layers constructed on each side of the active layer; and a pair of reflectors constructed one on each spacer layer and positioned on the side opposite from the active layer, where one of the reflectors transmits the second harmonic at a certain rate. The device is characterized in that the $<100>$ direction of the semiconductor crystals within the cavity makes an angle of 5 degrees or more with the direction of the light rays. Preferably, one of the $<111>$, $<211>$ and $<110>$ directions of the semiconductor crystals within the cavity roughly matches the direction of the light rays.

Here, $<a\ b\ c>$ (a, b, c are integers) are symbols indicating directions equivalent to [a b c]; for example, $<100>$ signifies the directions shown in Table I.

TABLE I

| [100] | [010] | [001] |
|-------|-------|-------|
| [$\overline{1}$00] | [0$\overline{1}$0] | [00$\overline{1}$] |

The principle behind second harmonic generation in the context of the present invention is summarized below. Overlined numbers are customarily used to indicate crystallographic axes/directions and orientations, but hereinafter a minus symbol is added to the displayed numbers instead.

Generally, a non-linear optical crystal is used when generating a second harmonic from a fundamental wave. In accordance with the present invention, a zincblende-type crystalline structure, such as GaAs, etc., may be used as such a crystal. When light is propagated through a zincblende-type crystal, a secondary (i.e., twice the fundamental frequency) non-linear polarization $P_{NL}$ is induced in the crystal, and a second harmonic is generated which has an electrical field in proportion to the size of the polarization $P_{NL}$.

Further, the amount of the generated second harmonic depends on the orientation of the semiconductor crystal of the cavity (including the phase-matching layer). Since this orientation is usually the same as that of the crystal making up the substrate, the relationship between the substrate orientation and the fundamental wave is actually the relationship between the crystal orientation making up the cavity and the fundamental wave, and thus, hereunder, the substrate orientation is treated as the crystal orientation of the cavity.

A case will now be considered wherein the x-axis of an x-y-z orthogonal coordinate system is set along the direction normal to the substrate surface and a fundamental wave is propagated in the direction of the x-axis. The x, y, and z components of the polarization $P_{NL}$, i.e., $P_{NLx}$, $P_{NLy}$, and $P_{NLz}$ may be represented as shown in Equation 1:

$$\begin{pmatrix} P_{NLx} \\ P_{NLy} \\ P_{NLz} \end{pmatrix} = \begin{pmatrix} d_{11}d_{12}d_{13}d_{14}d_{15}d_{16} \\ d_{21}d_{22}d_{23}d_{24}d_{25}d_{26} \\ d_{31}d_{32}d_{33}d_{34}d_{35}d_{36} \end{pmatrix} \begin{pmatrix} E_xE_x \\ E_yE_y \\ E_zE_z \\ 2E_yE_z \\ 2E_zE_x \\ 2E_xE_y \end{pmatrix}$$

Here, $P_{NLx}$, $P_{NLy}$ and $P_{NLz}$ represent the x, y and z components of the polarization $P_{NL}$, and the matrix elements dmn (m=1, 2, 3; n=1, 2, ..., 6) represent the coefficients relating the non-linear polarization to the electric field of the fundamental wave. The electric field components $E_x$, $E_y$, $E_z$ are the x, y and z components of the light fundamental wave. Also, since the fundamental wave is propagated along the direction of the x-axis, $E_x$ can be set to zero.

Matrices which include the symbol dmn are often only defined for the case where the x-axis is [100], the y-axis is [010] and the z-axis is [001]. Here, the definition is generalized in order to use the same symbol for any arbitrary set of orthogonal axes x, y and z.

Figure 4A:
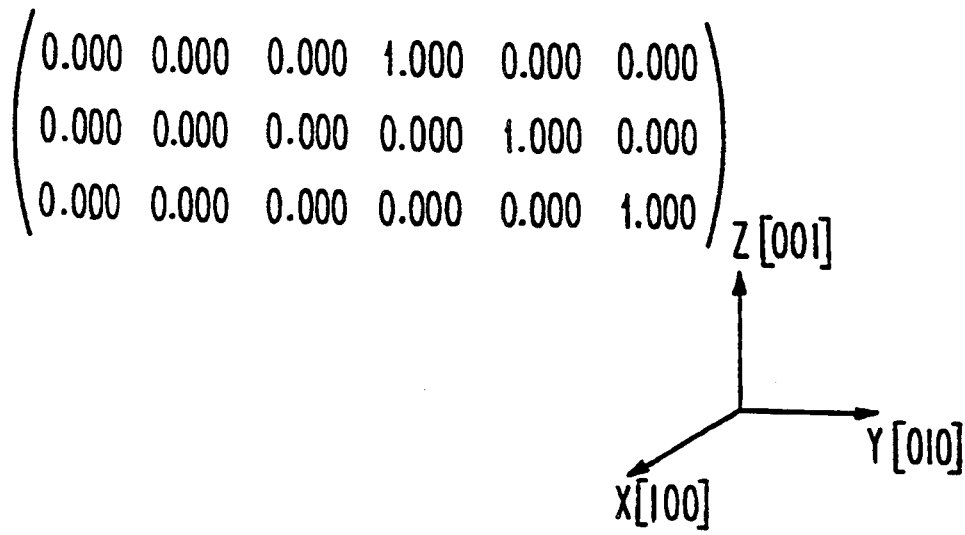
FIGS. 4(A) and 4(B) are drawings showing matrices of non-linear coefficients and substrate orientations for the purpose of explanation of the function of the present invention.

Assume a substrate such as the one shown in FIG. 4(A), wherein [100] is directed to the x-axis, [010] to the y-axis, and [001] to the z-axis. In this substrate, as shown in FIG. 4(A), the matrix element dmn holds non-zero values for $d_{14}=d_{25}=d_{36}$ (in FIG. 4(A) this is set to 1.000 for convenience of explanation), while the other elements of the matrix are zero. If fundamental light is propagated along the x-axis within the substrate, $P_{NLy}$ and $P_{NLz}$ both become zero, and therefore the generated second harmonic is not propagated along the x-axis (the direction perpendicular to the substrate surface).

Figure 4B:
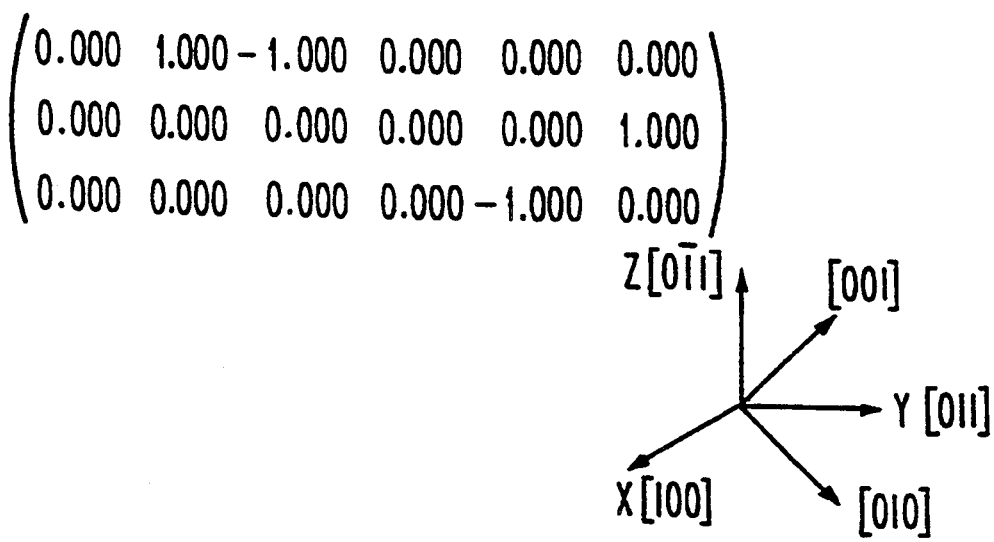

As shown in FIG. 4(B), when the substrate crystal in FIG. 4(A) are rotated $-45°$ around the x-axis, that is, when [100] is directed to the x-axis, [011] to the y-axis, and [0-11] to the z-axis, the second harmonic is not propagated along the x-axis, as is clear from the matrix elements.

Figure 5A:
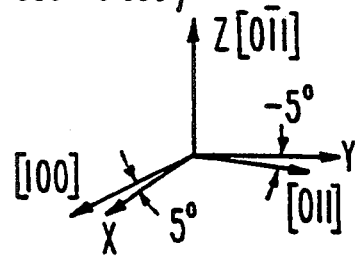
FIGS. 5(A), 5(B) and 5(C) are drawings showing matrices of non-linear coefficients and substrate orientations for the purpose of explanation of the function of the present invention.
Figure 5B:
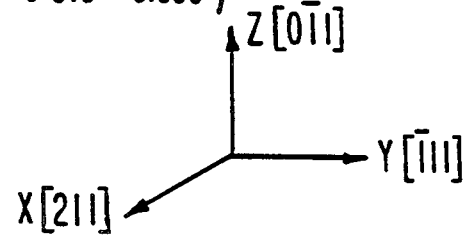
Figure 5C:
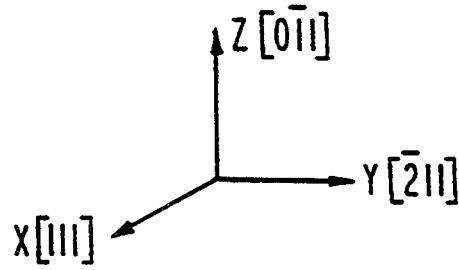
Figure 6:
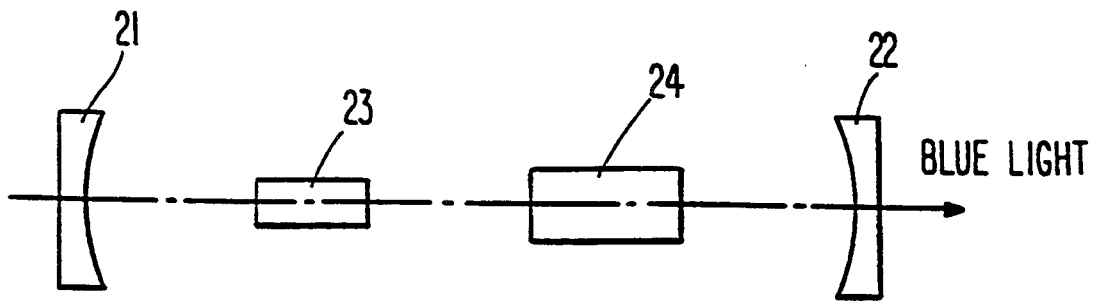
FIG. 6 is a drawing showing an embodiment of a second harmonic generating device according to the prior art.

For the case that the x-axis is not directed to [100], the change in efficiency of generating the second harmonic will be studied by using a few representative embodiments, wherein the substrate shown in FIG. 4(B) is rotated around the z-axis (or [0-11] axis) from the x direction to the y direction. These embodiments are shown in FIGS. 5(A)–5(C). The angles of rotation are $-5°$, about $-35.3°$ and about $-54.7°$, respectively. In FIG. 5(B), the x-axis is parallel to [211], the y-axis to [−111] and the z-axis to [0-11], while in FIG. 5(C) the x-axis is parallel to [111], the y-axis to [−211] and the z-axis to [0-11].

The non-linear coefficient matrix elements corresponding to the coordinate axes are shown respectively in FIGS. 4(A) and 4(B), and in FIGS. 5(A)–5(C). As is clear from these matrix elements, if $E_x=0$ for the rotation operation from FIG. 4(B) to FIG. 5(C), then the non-linear polarization $P_{NLy}$ and $P_{NLz}$ which contributes to the second harmonic propagated along the x-axis may be expressed as follows:

$$P_{NLy}=d_{22}E_yE_y+d_{23}E_zE_z$$

$$P_{NLz}=2d_{23}E_yE_z$$

(Note that $d_{34}=d_{23}$)

In simple terms, in this rotation, since $-d_{22} \geq d_{23} \geq 0$, the polarization parallel to the y-z plane $$P_{NL}=(P_{NLy}^2+P_{NLz}^2)^{\frac{1}{2}}$$

under the constant fundamental wave $$E=(E_y^2+E_z^2)^{\frac{1}{2}}$$

has its maximum value when the fundamental wave is polarized along the y-axis (that is, $E_z=0$, $E=E_y$).

On the other hand, if the fundamental wave is polarized along the y-axis, as the angle of rotation is larger, $P_{NL}$ increases and has a maximum value in the case of FIG. 5(B). When the angle of rotation is further increased, it decreases again, but since $-d_{22}=d_{23}$ in the case of FIG. 5(C), $$P_{NL}=-d_{22}E^2,$$

providing a very favorable property such that the efficiency of the second harmonic generation is independent of the polarization of the fundamental wave.

The actual calculation is not included here, but if the ratio is taken of the square of $P_{NL}$ in the case of FIG. 5(A) and the square of $P_{NL}$ in the case of FIG. 5(C), then $$(0.260/0.816)^2=0.1$$

The above equation supports that when the <100> direction of the substrate (i.e., the <100> direction of the semiconductor crystals within the cavity) makes a 5° angle with respect to direction of the light rays, it is possible to obtain roughly 10% of the second harmonic generation obtained when the <111> direction of the substrate (i.e., the <111> direction of the semiconductor crystals within the cavity) matches the direction of the light rays. If such 10% efficiency can be achieved, then an adequate practical use thereof is apparent, and this explains why the <100> direction of the semiconductor crystals within the cavity makes an angle of 5° or more with respect to the direction of the light rays.

The particulars of a case where the rotation is in a direction different from the one described above or where the rotation is around the y-axis are not described herein, but basically, in these cases as well, the following statements are true:

(1) as the angle between the x-axis and the <100> direction increases, so does $P_{NL}$;

(2) when the x-axis is in the direction <211> (see FIG. 5(B)) or in the direction <110>, the efficiency is maximized if the polarization of the fundamental wave is appropriate;

(3) when the x-axis is in the direction <111>, an efficiency is achievable which is slightly less than that in (2) above, but it does not depend on the polarization of the fundamental wave.

Some prior studies disclose the substrate's <100> direction oriented at an angle of about 4° with respect to the direction of the light rays. However, this is based on the fact that such an angle is favorable to the growth of the crystals, and is not based on the generation of a second harmonic. Therefore, the devices disclosed in these studies are not constructed so that the reflectors transmit the second harmonic.

In addition, since technology does not exist for generating the second harmonic using a surface emitting laser, there has been no attempt to take a phase-match for second harmonic generation.

As described above, if a second harmonic generating device is constructed such that the <100> direction of the semiconductor crystals within the cavity makes an angle of 5° or more with respect to the direction of the light rays (i.e., the bearing of the substrate surface), or such that any one of the <100>, <211> or <100> bearings of the crystals within the cavity roughly matches the direction of the light rays, it is possible to make a highly efficient extraction of the second harmonic.

Also, if material with a large non-linear coefficient, such as GaAs, etc., is used as a zincblende structure crystal, then an even higher generation efficiency of the second harmonic achievable.

As regards the second harmonic, when a phase match is not taken inside the cavity, the second harmonic generation is not very efficient, due to negative phase interference, etc. In order to prevent this, the present invention provides a phase-matching layer of a III-V or II-VI compound semiconductor superlattice constructed between the reflector which transmits the second harmonic and the spacer layer which is positioned on the reflector side. A variety of methods may be utilized to create the phase-matching layer according to the present invention, including a method which modulates the value of the non-linear coefficient and a method which inverts the sign, etc.

When phase matching is done by modulation of the non-linear coefficient, the superlattice structure is alternately laminated with different compositions, i.e., a III-V compound semiconductor (such as AlGaAs, InGaAs, AlGaInP, GaInAsP, etc.) and a II-VI group compound semiconductor (such as ZnCdSSe, ZnSSe, ZnCdS, etc.). In this manner, it is possible to reduce the negative phase interference of the second harmonic.

When creating a phase-matching layer using a II-VI compound semiconductor, it is possible from its high transmission of the second harmonic to widen the thickness of the phase-matching layer to a degree (e.g., about 30 μm) allowable by the fabrication process and which supports the lasing of the fundamental wave in the surface emitting laser.

It is further possible to form the spacer layer at the second harmonic output side, as well as the active layer and both of the spacer layers, using a superlattice of a III-V compound semiconductor functioning as a phase-matching layer. In such a case, if the number of laminations of the superlattice is increased, the efficiency of generation of the second harmonic is improved, but if the number is excessively increased, a stronger electrical resistance results and the generation of the fundamental wave itself is reduced.

The following is a more concrete description of the above principle.

Along with the fundamental wave (for example, wavelength $\lambda_1 = 870$ nm) inside the cavity, the second harmonic thereof (in this case, blue light of wavelength $\lambda_2 = \lambda_1/2$) is generated. As the fundamental wave is reflected inside the cavity by a reflector with a high reflectivity for the fundamental wave (for example, a reflectivity of 99% or over), the power of the wave becomes higher. On the other hand, the second harmonic is emitted out of the device by the output terminal reflector which transmits the second harmonic (for example, with a transmissivity of 50% or over).

The power of the fundamental wave is rather high in a vertical cavity surface emitting laser. The efficiency of generation of the second harmonic is proportional to the power of the fundamental wave, and thus a high-power second harmonic is generated.

Also, when the second harmonic is not phase-matched inside the cavity, the generated light is not efficiently amplified. It is therefore favorable to include a phase-matching layer inside the cavity, or to have the spacer layer and the active layer composed of a superlattice functioning as a phase-matching layer. Thus, a surface emitting device provided in accordance with the present invention generates a second harmonic with high efficiency.

Further, a second harmonic generating device according to the present invention may be constructed by using various types of surface emitting lasers, such as:
(1) a buried structure surface emitting laser;
(2) a mesa-cap structure surface emitting laser;
(3) a DBR surface emitting laser;
(4) a multi-quantum well surface emitting laser;
(5) a single-quantum well surface emitting laser;
(6) a multi-barrier surface emitting laser;
(7) a strained surface emitting laser; or
(8) combinations of (1)–(7);

and by adjusting the substrate orientation, and forming a superlattice phase-matching layer, and a superlattice spacer layer or active layer, etc.

In addition, in a surface emitting second harmonic generating device according to the present invention, III-V compound semiconductors, such as GaAs, AlGaAs, GaInAsP, AlGaInP, GaInAsP, etc., may be utilized, depending on the wavelength of the fundamental wave, while GaAs, GaAsP, etc., may be utilized as the substrate.

Figure 1:
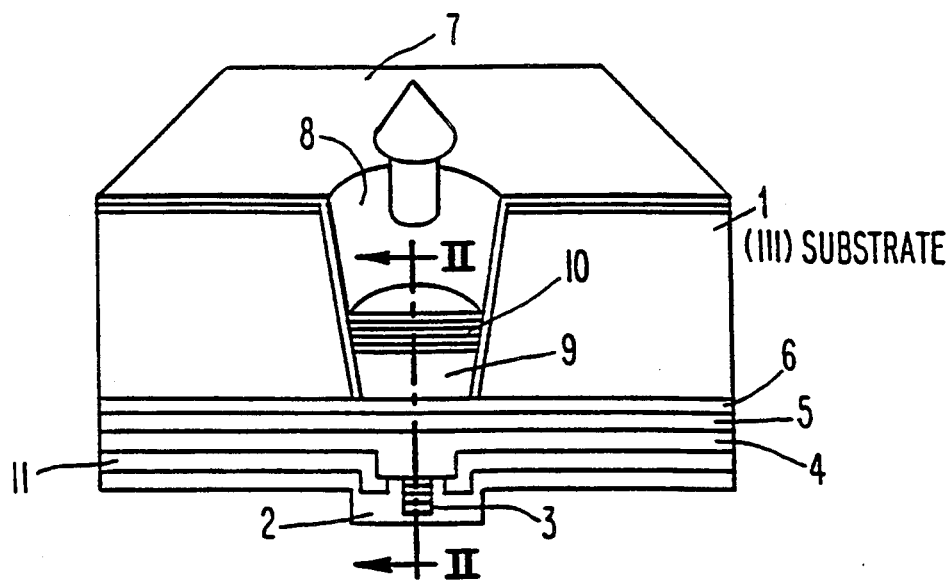
FIG. 1 is a drawing showing an example of a second harmonic generating device according to the present invention, providing a cross-sectional view of the entire device.

FIG. 1 is a cross-sectional diagram of an example of a surface emitting second harmonic generating device according to the present invention. The device in this example has a cavity, reflectors, etc., described hereinafter, which are constructed on a <111> GaAs substrate 1 (a substrate with a substrate orientation of <111>). A formed electrode 2 is formed on the bottom of the substrate, and a reflector 3 composed of multi-layer film is provided on the upper surface of the formed electrode 2. Further, as described above, the orientation of the semiconductor crystals within the cavity is identical to the substrate orientation, and thus the orientation of the latter determines that of the former.

Formed on the upper surface of the reflector 3 are a spacer layer 4, an active layer 5 and a spacer layer 6. Also, an insulation layer 11 is formed between the electrode 2 and the spacer layer 4 (except for the center section).

An electrode 7 is formed on the upper surface of the substrate 1, and the substrate is etched to form a second harmonic output port 8 on the side of the electrode 7.

In the output port 8, a phase-matching layer 9 is formed on the upper side of the spacer layer 6, and a reflector 10 for output of the second harmonic on the upper surface of the phase-matching layer 9 is paired with the reflector 3.

The cavity is composed of the above-mentioned reflectors 3, 10 and the layers formed between them (the layers comprised of the space layer 4, the active layer 5, the spacer layer 6 and the phase-matching layer 9).

In this example, the phase-matching layer 9 does not lie between the electrodes 2, 7 (in the section through which no current flows), as shown in FIG. 1. Therefore, disadvantages such as a decrease in the power of the fundamental wave due to an increase in electric resistance do not arise.

Figure 2:
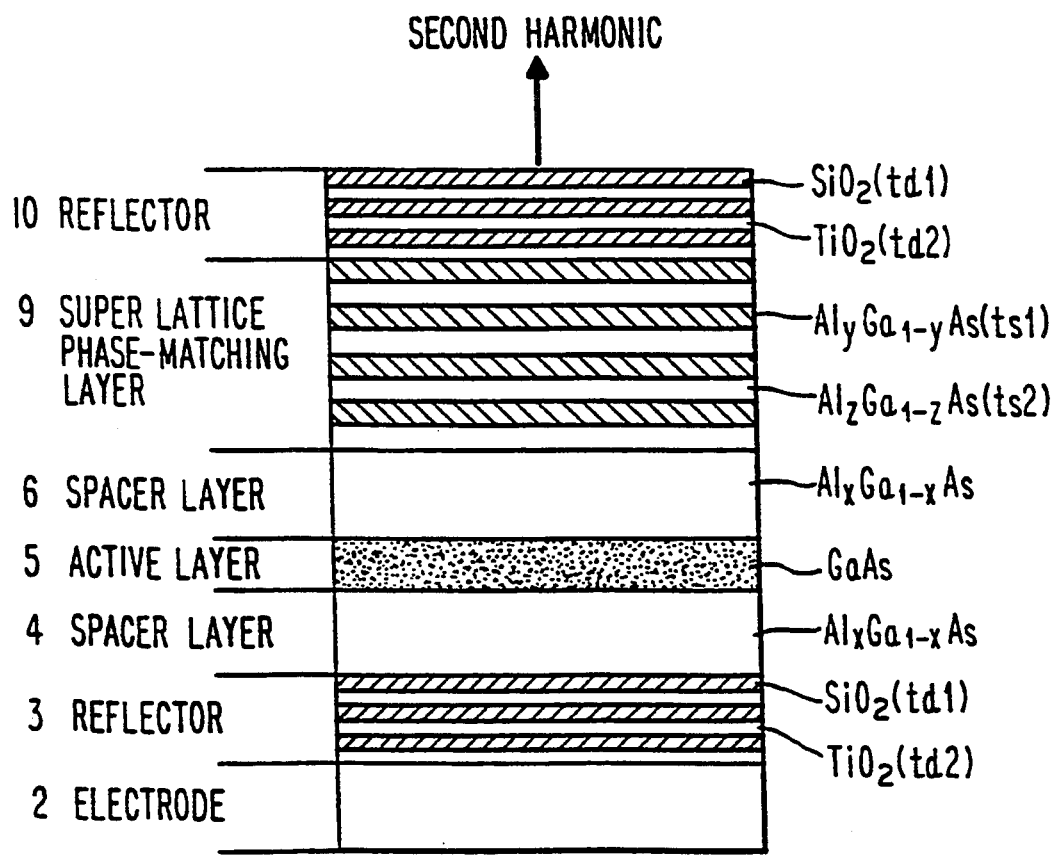
FIG. 2 is a cross-sectional diagram showing each layer of the section II in FIG. 1.

FIG. 2 is an enlarged diagram of the vertical cavity in FIG. 1. In FIG. 2, a dielectric multi-layered film (composed of alternating layers of SiO$_2$ and TiO$_2$) is used to form the reflector 10 at the output side, by piling up about 10 pairs (or more, depending on the process used) of the alternating layers, whose thicknesses t may be expressed as $$t_{d1} = \lambda_1/[4n_{d1}(\lambda_1)]; \text{ and}$$

$$t_{d2} = \lambda_1/[4n_{d2}(\lambda_1)], \text{ respectively.}$$

Here, $n(\lambda)$ is the refractive index at the wavelength $\lambda$, while the $\lambda_1$ is the wavelength of the fundamental wave. The subscript d1 denotes the film thickness and refractive index for SiO$_2$, while the subscript d2 denotes the film thickness and refractive index for TiO$_2$.

The phase-matching layer 9 has a superlattice structure and is composed of two AlGaAs layers with different contents of Al, represented by s1 and s2 (content of Al for s1: 50–90%; content of Al for s2: 10–50%).

Here, the thickness $t_{s1}$, $t_{s2}$ of each layer s1, s2 are determined using their respective reflective indices $n_{s1}(\lambda)$ and $n_{s2}(\lambda)$ in the following equation:

Equation 2

$$t_{s1} = [n_{s1}(\lambda_2)/\lambda_2 - 2n_{s1}(\lambda_1)/\lambda_1]^{-1/2}$$

$$t_{s2} = [n_{s2}(\lambda_2)/\lambda_2 - 2n_{s2}(\lambda_1)/\lambda_1]^{-1/2}$$

The total thickness of the phase-matching layer 9 is a few times greater than the reciprocal of the average absorption constant, i.e., about 2–20 μm.

In the above example, the substrate orientation was <111> (i.e., a <111> substrate was employed); however, the present invention is not limited to this, as a second harmonic may be generated, albeit with a difference in efficiency, using a substrate of a III-V compound semiconductor wherein its orientation is greatly different from <100>; this means that the substrate orientation makes an angle of 5° or more with respect to the <100> direction of the substrate crystal.

The active layer 5 may be composed of AlGaAs, etc., its composition being determined according to the wavelength of the fundamental wave.

The composition of the reflectors 3, 10 is not necessarily restricted to dielectric multi-layered films, and may be, for example, of semiconductor multi-layered films, metallic films, or a combination of metallic and dielectric films.

The reflector 10 on the output end needs only to have a reflectivity high enough to cause lasing of the fundamental wave, and a transmissivity high enough to extract the generated second harmonic. The reflector 3 on the non-output end need only have a reflectivity high enough to cause lasing of the fundamental wave. A semiconductor multi-layered film reflector may be used because its electrical resistance is lower than that of the dielectric multi-layered film.

In the above example, the superlattice of the phase-matching layer 9 was composed of an AlGaAs compound semiconductor, but it may be composed of any III-V compound semiconductor, such as InGaAs, AlGaInP, GaInAsP, etc. It may also be composed of a II-VI group compound semiconductor such as ZnCdSSe, ZnSSe, ZnCdS, etc.

As described above, when the phase-matching layer 9 is formed utilizing a II-VI group compound semiconductor, the width of the phase-matching layer 9 may be increased to a degree which is allowed by the fabrication process and which will support the lasing of the fundamental wave of the surface emitting laser.

Besides the above embodiments, any well-known method (see, for example, those shown in the reference by A. Yariv and the reference by D. Vahkshoori referred previously) may be employed to realize phase-matching. For example, the second harmonic may also be effectively generated even where the thickness of layers corresponding to Equation 2 takes the following values:

$$t_{s1} = [n_{s1}(\lambda_2)/\lambda_2]^{1/2}$$

$$t_{s2} = [n_{s2}(\lambda_2)/\lambda_2]^{-1/2}$$

This method is well known to realize phase-matching in standing waves.

Also, those described before utilize modulation in the value of the non-linear coefficients, but phase-matching is also possible through changing signs of the non-linear coefficients.

In addition to the method of modulation of a non-linear coefficient described in the above example in which the non-linear coefficient changes in a rectangular shape and each layer takes half part of phase shift (phase shift between second harmonic propagating and second harmonic being generated), any other ways of modulation may be used—for example, modulation with continuously changing non-linear coefficient or each layer not taking half part of phase shift, etc., as long as the negative phase interference can be effectively prevented.

Furthermore, due to the finite thickness of the whole phase-matching layers, the period of modulation of non-linear coefficient has a broad spectrum and accompanies a corresponding tolerance.

It is also possible to introduce a superlattice structure into the spacer layer or the active layer in order to fulfill the phase-matching condition, combining the function of these layers with that of the phase-matching layer (they may also be utilized as the phase-matching layer). In other words, by utilizing (i) the spacer layer, (ii) the spacer layer or the active layer on the second harmonic output side, and (iii) both the spacer layer and the active layer as the phase-matching layer, it is possible to reduce the thickness of the phase-matching layer or eliminate it.

Figure 3:
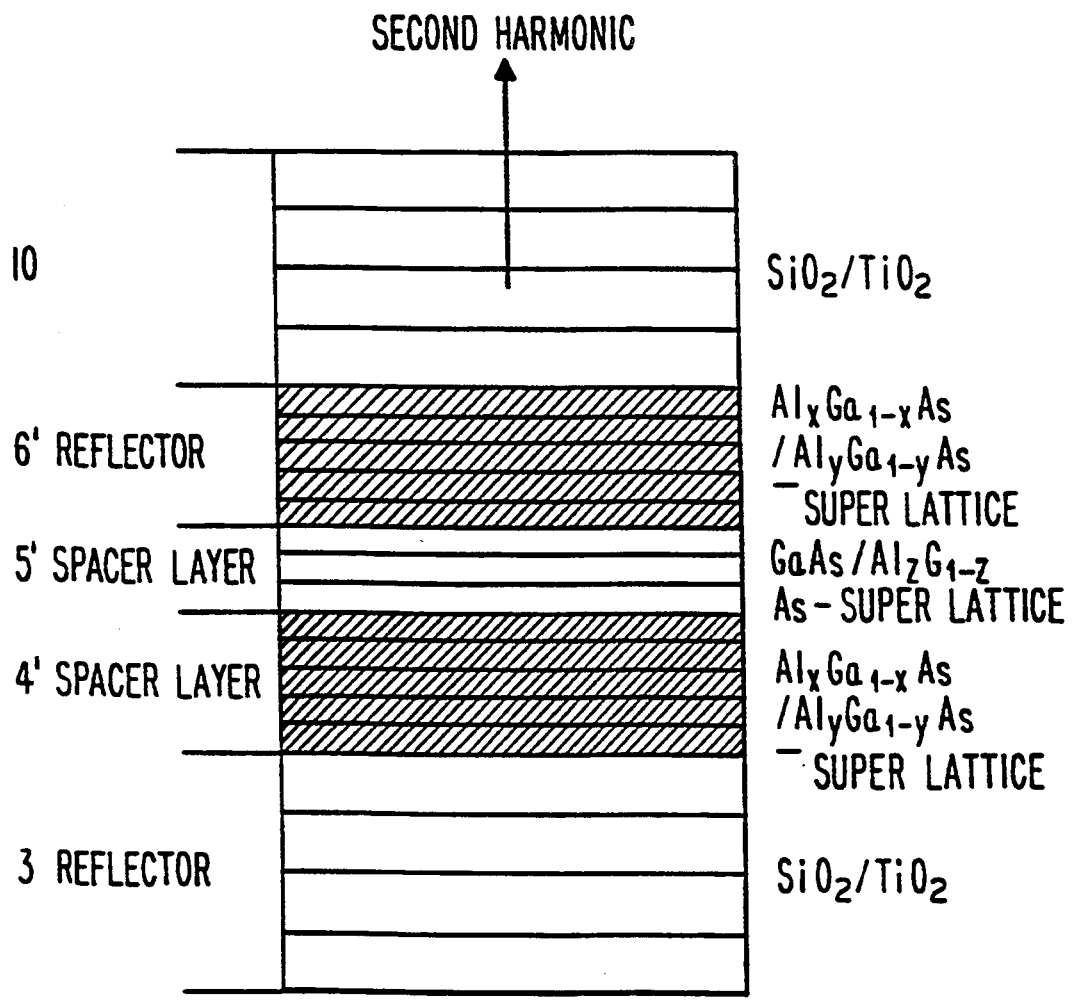
FIG. 3 is a cross-sectional diagram showing each layer of another example of a second harmonic generating device according to the present invention.

FIG. 3 illustrates an embodiment employing both the spacer layer and the active layer as the phase-matching layer. In this case, the thickness of the layer functioning as the phase-matching layer is adjusted to be a few times as great as the reciprocal of the absorption coefficient. As explained above, introduction of the superlattice being used as the phase-matching layer into the spacer layer or the active layer causes an increase in the electrical resistance of the semiconductor laser, resulting in a trade-off with efficiency of the second harmonic generation.

Nevertheless, the following statements are true:

(1) a phase-matching layer such as the one shown in FIG. 1 either becomes unnecessary or may be constructed more thinly;

(2) absorption loss of the fundamental wave is reduced due to (1);

(3) the modes are well unified, also due to (1); and (4) the fabrication process is facilitated, also due to (1).

In this case, a superlattice composed of two types of AlGaAs with different contents of Al (i.e., an $Al_xGa_{1-x}As/Al_yGa_{1-y}As$—superlattice, x=y, etc.) is used for the spacer layers 4', 6', while a superlattice composed of GaAs and AlGaAs (i.e., a $GaAs/Al_zGa_{-1-z}As$—superlattice) is used for the active layer 5'. Further, when the active layer is AlGaAs, it is formed by a superlattice composed of two types of AlGaAs with different contents of Al.

The present invention produces the following effects:

(1) A second harmonic may be emitted from a surface emitting device with high efficiency. Additionally, a wavelength from violet to green may be generated. Further, a wavelength from red to ultraviolet may be generated by modifying the materials, the substrate orientation, and the composition of the reflectors.

(2) A second harmonic generating device having a small size, low energy consumption and low manufacturing cost may be provided by utilizing the inherent advantages of the surface emitting laser.

Consequently, since a circular, single mode second harmonic may be generated, it may be efficiently coupled into fibers, etc. In addition, multiple devices can be easily arrayed, and it is possible to emit different monochrome wavelengths from each of the arrayed devices.

What is claimed is:

1. A surface emitting second harmonic generating device, comprising, as a cavity:
   an active layer composed of semiconductor crystals of a III-V group compound;
   a first spacer layer disposed on a first side of said active layer and a second spacer layer disposed on a second side of said active layer; and
   a first reflector disposed on said first spacer layer opposite said active layer and a second reflector disposed on said second spacer layer opposite said active layer, wherein said second reflector transmits the second harmonic at a prescribed rate;
   wherein the <100> direction of said semiconductor crystals makes an angle of at least 5° with respect to the direction of light rays propagating in said cavity.

2. A surface emitting second harmonic generating device according to claim 1, wherein one of the <111>, <211> and <110> directions of the semiconductor crystals within said cavity approximately matches the direction of the light rays.

3. A surface emitting second harmonic generating device according to claim 1, wherein a phase-matching layer of superlattice structure, composed of one of a III-V and II-VI compound semiconductor and having an orientation substantially identical to that of the semiconductor crystals within said cavity, is disposed between the second reflector which transmits the second harmonic at said prescribed rate and the second spacer layer.

4. A surface emitting second harmonic generating device according to claim 2, wherein a phase-matching layer of superlattice structure, composed of one of a III-V and II-VI compound semiconductor and having an orientation substantially identical to that of the semiconductor crystals within said cavity, is disposed between the second reflector which transmits the second harmonic at said prescribed rate and the second spacer layer.

5. A surface emitting second harmonic generating device according to claim 1, wherein the second spacer layer is composed of a superlattice which also functions as a phase-matching layer.

6. A surface emitting second harmonic generating device according to claim 4, wherein the second spacer layer is composed of a superlattice which also functions as a phase-matching layer.

7. A surface emitting second harmonic generating device according to claim 1, wherein the active layer and at least one of the spacer layers are composed of superlattices which also function as phase-matching layers.

8. A surface emitting second harmonic generating device according to claim 2, wherein the active layer and at least one of the spacer layers are composed of superlattices which also function as phase-matching layers.

9. A surface emitting second harmonic generating device according to claim 3, wherein at least one of the spacer layers is composed of superlattices which also function as a phase-matching layer.

10. A surface emitting second harmonic generating device according to claim 3, wherein the active layer and at least one of the spacer layers are composed of superlattices which also function as phase-matching layers.

11. A surface emitting second harmonic generating device according to claim 4, wherein at least one of the spacer layers is composed of superlattices which also function as a phase-matching layer.

12. A surface emitting second harmonic generating device according to claim 4, wherein the active layer and at least one of the spacer layers are composed of superlattices which also function as phase-matching layers.

13. A surface emitting second harmonic generating device, comprising:
   an active layer composed of semiconductor crystals of a III-V group compound;
   a first spacer layer disposed below said active layer on a first side of said active layer, and a second spacer layer disposed above said active layer on a second side of said active layer; and
   a first reflector disposed below said first spacer layer, opposite said active layer, and a second reflector disposed above said second spacer layer, opposite said active layer, wherein said second reflector transmits the second harmonic at a rate of at least 50%;
   wherein the <100> direction of said semiconductor crystals makes an angle of at least 5° with respect to the direction of light rays propagating in said cavity, and wherein one of the <111>, <211> and <110> directions of the semiconductor crystals within said cavity approximately matches the direction of the light rays.

14. A surface emitting second harmonic generating device according to claim 13, wherein a phase-matching layer of superlattice structure, composed of one of a III-V and II-VI compound semiconductor and having an orientation substantially identical to that of the semiconductor crystals within said cavity, is disposed between the second reflector and the second spacer layer.

15. A surface emitting second harmonic generating device according to claim 14, wherein the second spacer layer is composed of a superlattice which also functions as a phase-matching layer.

16. A surface emitting second harmonic generating device according to claim 14, wherein the active layer and the spacer layers are composed of superlattices which also function as phase-matching layers.

* * * * *